United States Patent
Alvarez et al.

(10) Patent No.: US 9,585,275 B2
(45) Date of Patent: Feb. 28, 2017

(54) ELECTRONIC DEVICES WITH MOISTURE GUIDING STRUCTURES

(71) Applicant: Apple Inc., Cupertino, CA (US)

(72) Inventors: Felix Alvarez, San Jose, CA (US); Kyle H. Yates, Moss Beach, CA (US)

(73) Assignee: Apple Inc., Cupertino, CA (US)

( * ) Notice: Subject to any disclaimer, the term of this patent is extended or adjusted under 35 U.S.C. 154(b) by 7 days.

(21) Appl. No.: 14/473,065

(22) Filed: Aug. 29, 2014

(65) Prior Publication Data

US 2014/0369012 A1 Dec. 18, 2014

Related U.S. Application Data

(62) Division of application No. 12/871,804, filed on Aug. 30, 2010, now Pat. No. 8,824,162.

(51) Int. Cl.
  *H05K 1/16* (2006.01)
  *H05K 5/06* (2006.01)
  *H05K 5/02* (2006.01)
  *B05D 1/02* (2006.01)
  *B05D 1/18* (2006.01)
  *B05D 1/28* (2006.01)
  (Continued)

(52) U.S. Cl.
  CPC ............. *H05K 5/065* (2013.01); *B05D 1/02* (2013.01); *B05D 1/18* (2013.01); *B05D 1/28* (2013.01); *B05D 1/322* (2013.01); *H05K 3/282* (2013.01); *H05K 3/284* (2013.01); *H05K 5/0213* (2013.01); *H05K 5/069* (2013.01); *H05K 7/1427* (2013.01)

(58) Field of Classification Search
  CPC ......... H05K 3/284; H05K 2201/09436; H05K 2201/09872; H05K 2201/10977; H05K 2203/0591; H05K 3/28; H05K 2203/0759; H05K 2203/1377; H05K 5/0056; H01L 23/28; H01L 23/564; C23C 10/04; C23C 14/04; C23C 14/042; C23C 18/06; C23C 18/1603; C23C 2/006; C23C 2/02; C23C 4/005; C23C 8/04
  USPC ......... 427/96.1, 96.2, 96.4, 96.6, 96.9, 97.3, 427/98.4; 361/751, 765

See application file for complete search history.

(56) References Cited

U.S. PATENT DOCUMENTS 3,931,454 A * 1/1976 Sprengling ............ H05K 3/285
174/254
5,545,494 A 8/1996 Trumble et al.
(Continued)

FOREIGN PATENT DOCUMENTS

| CN | 101739074 | 6/2010 |
| JP | 200960165 | 3/2009 |

*Primary Examiner* — Binh Tran
(74) *Attorney, Agent, or Firm* — Treyz Law Group, P.C.; G. Victor Treyz; Joseph F. Guihan

(57) ABSTRACT

Electronic devices may have housings in which components are mounted. Some of the components may be sensitive to moisture. Other components may be insensitive to moisture and may form openings in a device housing that allow moisture to escape from within the housing. Components may be mounted on substrates such as printed circuit board substrates. Moisture repelling layers and moisture attracting layers may be patterned to form channels and other structures that guide moisture away from sensitive components towards insensitive components. Moisture repelling and attracting layers may also be used to limit the lateral spread of a conformal coating layer when coating components.

14 Claims, 9 Drawing Sheets

(51) Int. Cl.
*B05D 1/32* (2006.01)
*H05K 3/28* (2006.01)
*H05K 7/14* (2006.01)
*H05K 1/00* (2006.01)

(56) References Cited

U.S. PATENT DOCUMENTS

| | | | |
|---|---|---|---|
| 5,681,122 A * | 10/1997 | Burke | G06F 3/0202 |
| | | | 200/302.2 |
| 7,189,082 B2 | 3/2007 | Fukushima et al. | |
| 7,189,108 B2 | 3/2007 | Takaya et al. | |
| 7,365,281 B2 | 4/2008 | Yamaguchi et al. | |
| 7,782,610 B2 | 8/2010 | Diebel et al. | |
| 8,246,383 B2 | 8/2012 | Schmidt et al. | |
| 8,276,268 B2 * | 10/2012 | Kapusta | H05K 1/0218 |
| | | | 29/832 |
| 8,339,760 B2 | 12/2012 | Rabu et al. | |
| 8,506,327 B2 | 8/2013 | Jol et al. | |
| 2004/0147656 A1 * | 7/2004 | Machida | C08K 3/22 |
| | | | 524/430 |
| 2004/0179709 A1 | 9/2004 | Niederdraenk et al. | |
| 2005/0205281 A1 | 9/2005 | Bachinski et al. | |
| 2008/0094232 A1 | 4/2008 | Yokote | |
| 2009/0159119 A1 | 6/2009 | Basol | |
| 2009/0273480 A1 | 11/2009 | Mittleman et al. | |

* cited by examiner

ELECTRONIC DEVICES WITH MOISTURE GUIDING STRUCTURES

This application is a division of patent application Ser. No. 12/871,804, filed Aug. 30, 2010, which is hereby incorporated by reference herein in its entirety. This application claims the benefit of and claims priority to patent application Ser. No. 12/871,804, filed Aug. 30, 2010.

BACKGROUND

This relates generally to electronic devices, and, more particularly, to materials within electronic devices that control moisture.

Electronic devices are often exposed to moist environments. As an example, a user may operate a cellular telephone or media player outdoors when there is precipitation. Devices may also be exposed to moisture in the form of perspiration.

Waterproof devices are able to withstand exposure to moisture. Waterproof housings are, however, often impractical for normal use. Conventional electronic devices are therefore vulnerable to moisture-induced damage, particularly when sensitive device components such as buttons are subjected to prolonged contact with moisture.

Conformal coatings are sometimes used to encapsulate device components and make them less vulnerable to moisture exposure. It can be difficult, however, to accurately control the application of conformal coatings, because conformal coatings often have a tendency to spread out over the substrates on which they are applied. Conformal coatings are also not always effective at blocking moisture.

It would therefore be desirable to be able to provide electronic devices with improved configurations for protecting vulnerable device components from exposure to moisture.

SUMMARY

Electronic devices may have housings in which components are mounted. An electronic device may, for example, have buttons, input-output port connectors, integrated circuits, displays, microphones, speakers, sensors, and other components.

Some of the components may be sensitive to moisture. For example, components such as buttons based on dome switches may be sensitive to the presence of water.

Other components may be insensitive to moisture and may form openings in a device housing that allow moisture to escape from within the housing. For example, a data port connector may have input-output pins that are relatively unaffected by small amounts of moisture and that may be mounted in an opening at the lower end of a device where moisture can exit the device.

During normal operation, a device may be exposed to moisture from precipitation or perspiration. The moisture may enter the interior of the housing of an electronic device through gaps. To prevent damage to sensitive components mounted within the device housing, moisture repelling and attracting layers may be patterned on printed circuit boards, conformal coating layers, and other internal structures of the device.

For example, moisture repelling layers and moisture attracting layers may be patterned on printed circuit board substrates with or without conformal coating layers to form channels that guide moisture away from sensitive components towards insensitive components. Moisture repelling and attracting layers may also be used to limit the lateral spread of a conformal coating layer during the process of forming the conformal coating layer over a sensitive component.

Further features of the invention, its nature and various advantages will be more apparent from the accompanying drawings and the following detailed description of the preferred embodiments.

DETAILED DESCRIPTION

Figure 1:
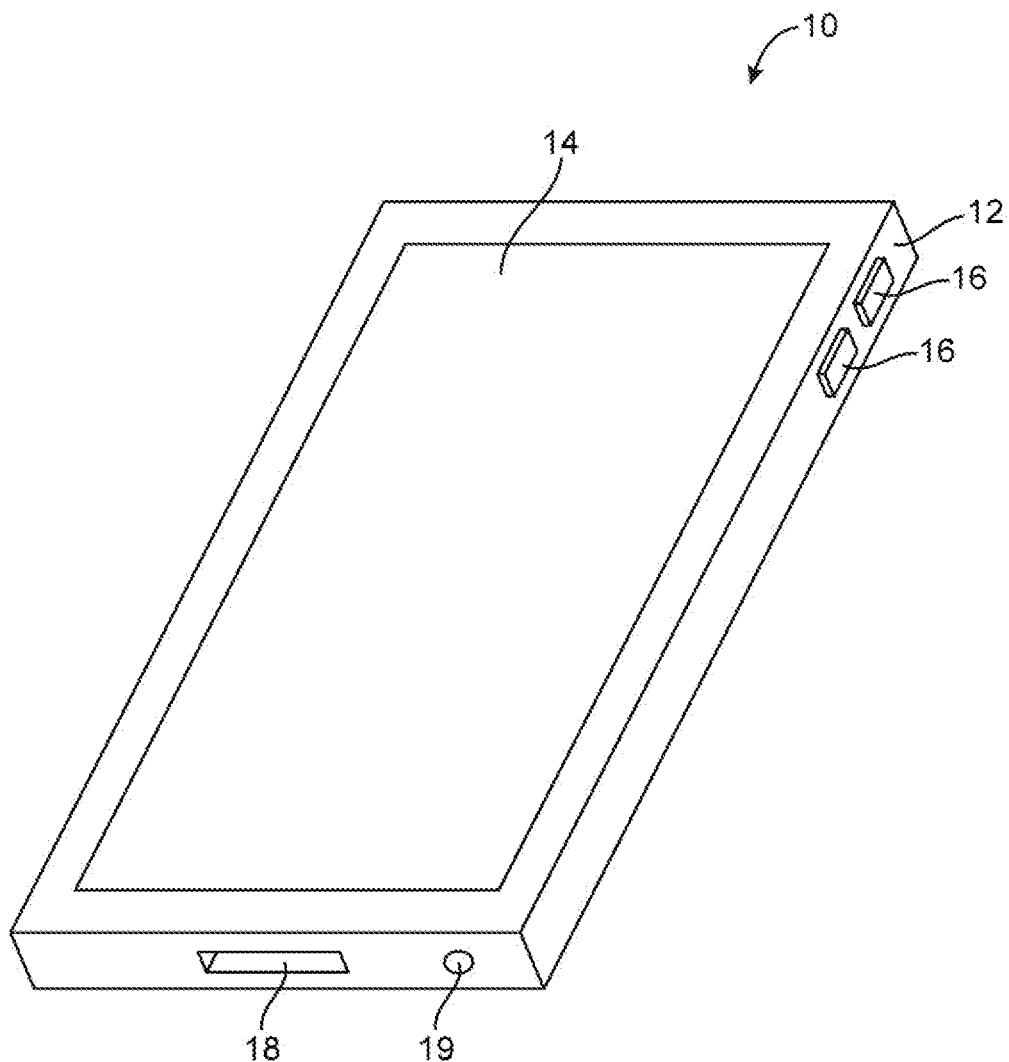
FIG. 1 is a perspective view of an illustrative electronic device in accordance with an embodiment of the present invention.

Electronic device 10 of FIG. 1 may be a cellular telephone, media player, computer, handheld device, portable computer, tablet computer, Global Positioning System device, camera, gaming device, or other electronic equipment.

As shown in FIG. 1, device 10 may have a housing such as housing 12. Housing 12 may be formed from plastic, metal, carbon fiber composite material, other composites, glass, ceramics, other materials, or combinations of these materials. Housing 12 may be formed from multiple pieces of material or may be formed using a unibody construction in which housing 12 is substantially formed from a single structure (e.g., machined or cast metal, plastic, etc.).

Device 10 may have input-output devices such as input-output ports, speakers, microphones, displays, status indicator lights, touch screens, buttons, proximity sensors, wireless circuitry, accelerometers, ambient light sensors, touch pads, and other devices for accepting input from a user or the surrounding environment of device 10 and/or for providing output to a user of device 10.

As shown in the illustrative configuration of FIG. 1, device 10 may, as an example, have a display such as touch screen display 14. One or more buttons 16 may be used to gather user input. Buttons 16 may be based on dome switches or other switch circuitry. Buttons 16 may include button members that form push buttons (e.g., momentary buttons), slider switches, rocker switches, etc. Connector port 18 may be, for example, a 30-pin connector for a 30-pin data port, a Universal Serial Bus port, or other input-output port. Port 19 may be, for example, a signal port such as an audio jack for receiving an audio plug. Additional buttons such as buttons 16, additional data ports such as port 18, and additional signal ports such as audio connector port 19, and other input-output devices may be provided if desired. The example of FIG. 1 is merely illustrative.

Devices such as device 10 may be vulnerable to moisture. For example, moisture may wick into gaps in device housing 12 or gaps between internal device components. When moisture reaches sensitive device components such as button components, integrated circuits, or other circuitry that is susceptible to malfunctions when wet, device 10 may fail.

Figure 2:
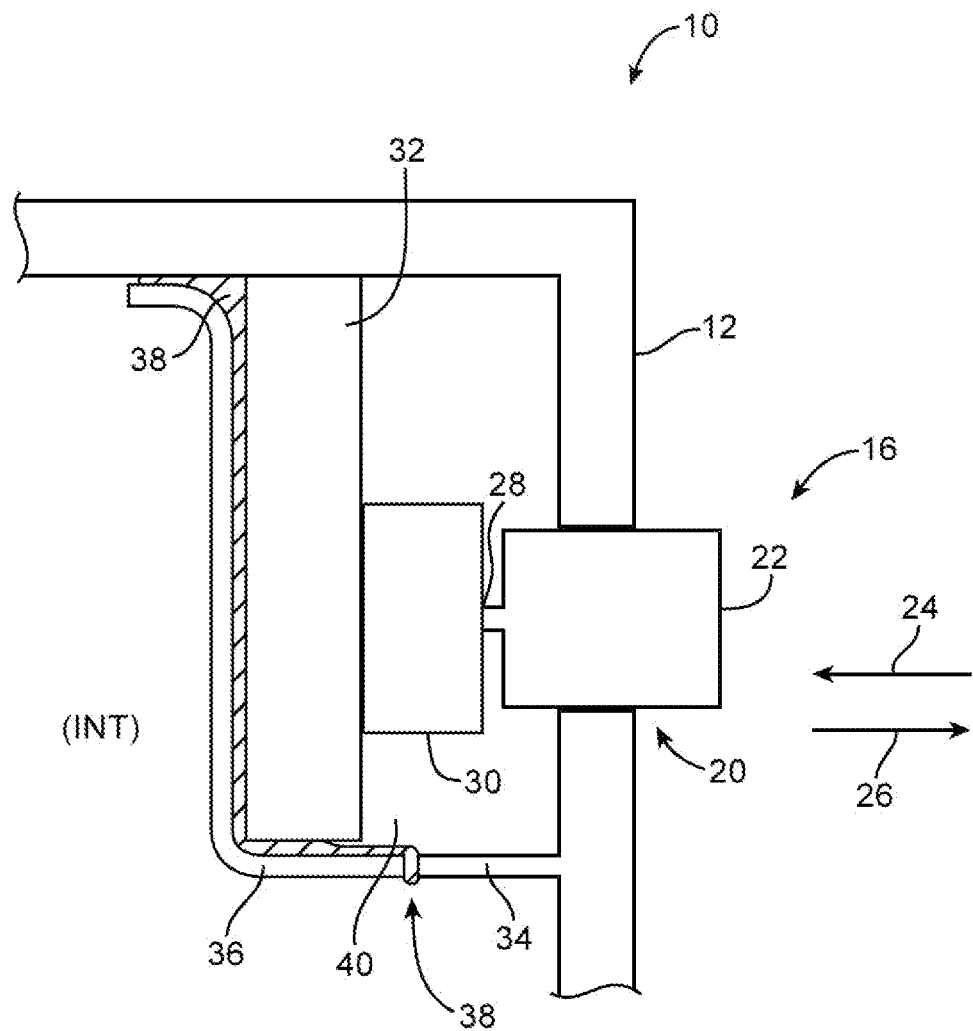
FIG. 2 is a cross-sectional side view of a portion of an electronic device including a button and internal device components such as a button switch and mounting structures in accordance with an embodiment of the present invention.

FIG. 2 is a cross-sectional view of a portion of device 10 in the vicinity of one of buttons 16. As shown in FIG. 2, button 16 may have a button member such as button member 22 that reciprocates within opening 20 of housing 12. When a user presses the exterior of button member 22 in direction 24, portion 28 of button member 22 may press against a dome switch or other switch mechanism in switch structure 30, thereby activating the switch (e.g., shorting internal switch terminals together to close the switch). A dome member or other biasing element may push button member 22 outward in direction 26 when the user releases pressure from button member 22.

A support bracket such as support bracket 32 may be used to mount switch structure 30. To prevent moisture that has intruded into the interior of device 10 from contacting switch structure 30, switch structure 30 may be sealed from the interior (INT) of device 10 using flexible sheet 36. Sheet 36 may be formed from a moisture barrier material such as a layer of polyimide (e.g., a polyimide flexible printed circuit of the type that is sometimes referred to as a flex circuit). Flex circuit 36 may be attached to bracket 32 using adhesive 38. Adhesive 38 may help form a seal between flex circuit 36 and nearby structures such as the interior walls of device housing 12 and internal housing member 34. Nevertheless, gaps may form such as illustrative gap 38, that allow moisture to penetrate region 40 adjacent to switch structure 30 from interior INT. Moisture may also penetrate region 40 through the gaps that are formed between the surface of button member 22 and the surrounding sidewalls of opening 20 of housing 12.

Switch structure 30 may include a dome switch or other mechanism that is prone to failure if exposed to moisture (e.g., short term and/or long term moisture exposure from water or other liquids). Switch structure 30 therefore represents an example of a device component that exhibits sensitivity to moisture. Other moisture-sensitive device components may include integrated circuits, discrete circuit components such as resistors, inductors, and capacitors, display structures, touch sensor circuitry, and sensor circuits (as an example). These sensitive circuits may be vulnerable to moisture exposure due to weather conditions, perspiration, accidental spills, and other sources.

Other components in device 10 may be relatively insensitive to moisture. An example of a component that may be considered insensitive to moisture is connector 18. Connector 18 may contain input-output pins that receive a mating connector (e.g., a 30-pin plug on the end of a cable). Although connector 18 may not be waterproof, it may be less likely to exhibit a serious failure than sensitive component such as one of buttons 16 when exposed to moisture.

In environments such as these, it may be advantageous to control the flow of moisture within device 10. Coatings such as coatings that repel and attract moisture may be patterned to form regions of device 10 that repel moisture (e.g., regions that repel moisture away from sensitive components) and regions that attract moisture (e.g., moisture guiding channels that help route water away from sensitive components and towards insensitive components). A moisture repelling coating may, for example, be used to cover some or all of flex circuit 36 and gap 38 of FIG. 2 to direct moisture away from gap 38. Components such as connector 18 may not only be relatively insensitive to moisture, but may also serve as exit ports that allow moisture to escape from the interior of housing 12. Structures that guide moisture towards components such as connector 18 may therefore help reduce moisture damage.

Figure 3:
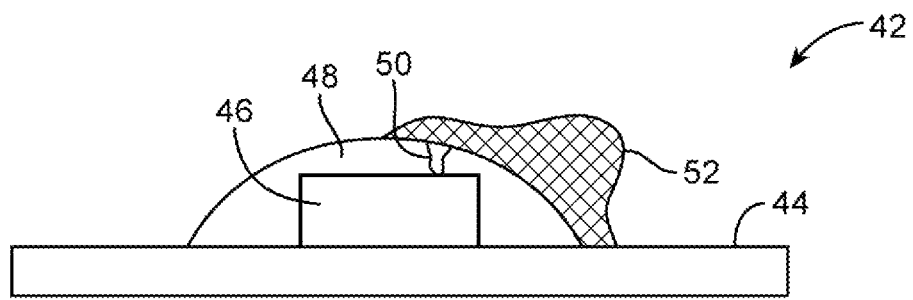
FIG. 3 is a cross-sectional side view of a conventional encapsulated integrated circuit showing how moisture can penetrate encapsulant pinholes.

FIG. 3 is a cross-sectional side view of a conventional integrated circuit mounting arrangement. As shown in FIG. 3, integrated circuit 46 has been mounted on printed circuit board 44. Conformal coating 48 has been used to cover integrated circuit 46. Conformal coating 48 may have a pinhole such a pinhole 50. When moisture 52 (e.g., water) comes into contact with conformal coating 48, some of moisture 52 may penetrate through coating 48 via pinhole 50. If moisture 52 reaches component 46, component 46 may fail.

Figure 4:
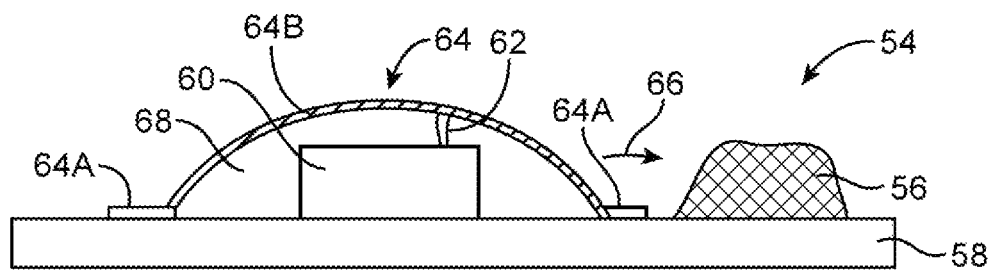
FIG. 4 is a cross-sectional side view of a component such as an integrated circuit that is covered with encapsulant showing how patterned coatings may be used to prevent moisture damage in accordance with an embodiment of the present invention.

FIG. 4 is a cross-sectional side view of a component mounting scheme of the type that may be used within device 10 of FIG. 1. As shown in FIG. 4, component 60 may be mounted on substrate 58. Component 60 may be an integrated circuit, a button (e.g., a dome switch for a button), or other sensitive device component. Substrate 58 may be a rigid printed circuit board substrate (e.g., fiberglass filled epoxy such as FR4), a flexible polymer printed circuit board such as a polyimide printed circuit board (i.e., a "flex circuit"), rigid flex, glass, ceramic, or other substrate. Device components can also be mounted on housing structures and other structures in device 10.

Conformal coating 68 may be used to cover component 60. Conformal coating 68 may be formed from materials such as epoxy, silicone, parylene, acrylic, polyurethane, other polymers, other dielectrics, etc.

To help prevent moisture 56 from reaching sensitive component 60 and to help control the lateral dimensions of conformal coating 68, patterned coating layers such as layer 64 may be formed on substrate 58. Layer 64 may include liquid repelling coating material and/or liquid attracting coating material. As an example, material 64A may be formed from a material such as an oleophobic coating material that repels conformal coating 68 and thereby constrains the lateral dimensions of coating 68 and layer 64B may be a hydrophobic material that repels moisture 56 (e.g., so that moisture 56 travels in direction 66). By preventing moisture 56 from resting above pinhole 62 in conformal coating 68, moisture penetration to sensitive component 60 may be avoided or reduced.

Coating layers such as layer 64 may repel liquids such as water, liquids such as conformal coating materials, and other liquids (e.g., oils, adhesives, etc.). Coating layers such as layer 64 are sometimes referred to herein as hydrophobic layers (layers that repel liquids such as water and potentially other liquids), hydrophilic layers (layers that attract liquids such as water and potentially other liquids), oleophobic layers (layers that repel oils and oily substances and that may potentially repel other liquids and conformal coatings), and oleophilic layers (layers that attract oils and oily substances and that may potentially attract other liquids and conformal coatings). The properties of these coating materials need not be mutually exclusive. For example, a hydrophobic coating may also be oleophobic, a hydrophilic coating may also be oleophilic, etc.

Examples of hydrophobic materials that may be patterned to form patterned hydrophobic coating layers include parylene, silicone, and polytetrafluoroethylene. Materials such as these may also be oleophobic. Examples of hydrophilic materials that may be patterned to form patterned hydrophilic coating layers include metal oxides (e.g., titanium dioxide), materials in which metal oxide particles have been incorporated within a binder, polyurethanes, and polyethylene oxide. Materials such as these may also be oleophilic. Surface treatments may also be used to form moisture attracting and moisture repelling regions. For example, a surface (e.g., a surface of one material or a surface of multiple materials) may be roughened to increase its hydrophilic and oleophilic properties or may be smoothed to decrease these properties.

Coating layers such as layer 64 may be applied and patterned by spraying, dipping, inkjet printing, painting, pad printing, screen printing, shadow masking, lift-off, etc. Coating layers may be heated to dry out the coating material and/or to thermally cure the material. Coating layers may also be cured by application of light and using two-part chemical mixtures.

Layers such as layer 64 may be patterned to control the positioning and movement of conformal coatings such as coating 68 and/or to control the positioning and movement of moisture that intrudes into the interior of device 10 such as water (e.g., from precipitation, from perspiration, etc.).

Figure 5:
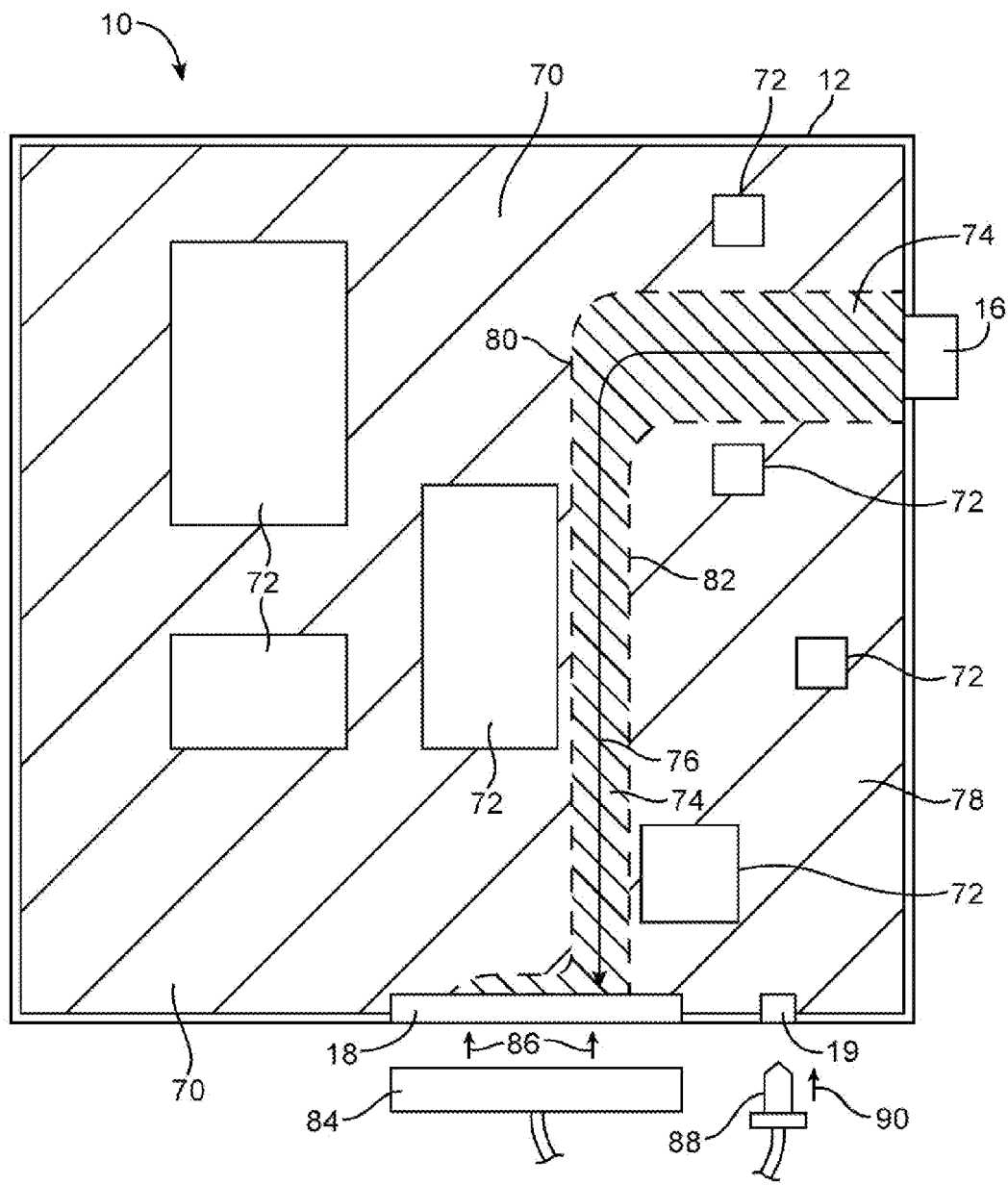
FIG. 5 is a top view of an interior of an illustrative electronic device showing how coatings can be patterned to create a moisture flow path between a sensitive component region and an insensitive component region in accordance with an embodiment of the present invention.

FIG. 5 is a top view of the interior of an illustrative electronic device. As shown in the example of FIG. 5, device 10 may have one or more internal structures such as printed circuit boards, other substrates, and other mounting structures (e.g., parts of housing 12, etc.) that are mounted within housing 12 (i.e., the structures shown as being located within the rectangular boundary of housing 12 in FIG. 5). Sensitive components 72 (e.g., a sensitive component such as sensitive component 60 of FIG. 4) may be mounted on these internal structures. A sensitive component such as button 16 may be mounted on internal structures such as a printed circuit board or support structure through an opening in a sidewall of housing 12.

Water may enter the interior of device 10 through a gap between button 16 and housing 12. To prevent sensitive components 72 from becoming damaged and to route the intruding water (or other moisture) away from button 16 and towards a safer location, coating layers may be patterned to form a moisture guiding structures. For example, region 70 and region 78 may be coated with a moisture repelling layer such as a hydrophobic coating. Region 74 may be coated with a moisture attracting substance such as a hydrophilic coating (or a coating that is at least less hydrophobic than the coatings of regions 70 and 78). Dashed line 80 represents the boundary between hydrophobic region 70 and hydrophilic (or at least less hydrophobic) region 74. Dashed line 82 represents the boundary between hydrophobic region 78 and hydrophilic (or at least less hydrophobic) region 74.

Connector 18 may be a 30-pin data connector that mates with corresponding 30-pin data connector 84 when connector 84 is moved in direction 86. Connector 19 may be an audio jack that receives audio plug 88 when plug 88 is moved in direction 90. Connectors (e.g., connector 18) may be less sensitive than components such as button 16 (e.g., a dome-switch button) when exposed to water and other moisture. Connectors such as connector 18 may also serve as an opening (exit) that allows internal moisture to pass from the interior of device 10 to the exterior of device 10. In this type of device environment, it may be desirable to direct moisture away from button 16 towards connector 18 (or, in robust audio jack configurations, towards connector 19). This prevents the moisture from remaining near button 16, which is sensitive, and allows the moisture to reside instead near connector 18. The opening formed by connector 18 may also allow the moisture to escape from device 10.

The pattern formed by regions 70, 74, and 78 may form a moisture-guiding path (e.g., a path bounded by lines 80 and 82 and covering the area occupied by region 74). As indicated by arrow 76, the moisture-guiding path may help guide moisture from button 16 to connector 18. By encouraging moisture to move from the vicinity of button 16 to the vicinity of connector 18, potential device failures may be minimized. The use of hydrophobic coatings over regions 70 and 78 may also serve to repel moisture from underlying sensitive components 72.

Figure 6:
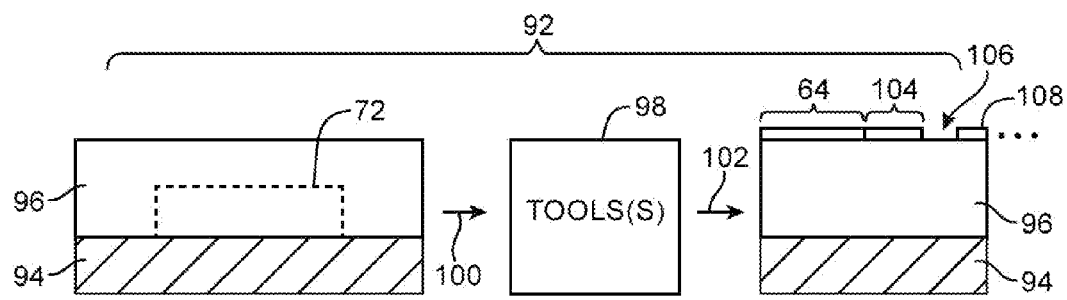
FIG. 6 is a diagram showing how coating patterning equipment may be used to provide coatings with the ability to repel and attract liquids in accordance with an embodiment of the present invention.

FIG. 6 shows a system (system 92) in which tools 98 may be used to form patterned coating layers for structures in device 10. Initially, no coatings may be applied, as shown on the left of FIG. 6. In this configuration, structures 94 and optional conformal coating 96 may be uncovered by additional coatings. Structures 94 may be substrates such as printed circuit boards (flex circuits, rigid printed circuit boards, or rigid flex), components mounted on printed circuit boards (e.g., integrated circuit packages), sensitive components such as component 60 of FIG. 4 and components 72 of FIG. 5, other components, structures such as internal housing structures, etc. Layer 96 may be a conformal coating such as coating 68 of FIG. 4 and may include embedded sensitive components such as component 60 of FIG. 4 and components 72 of FIG. 5.

As indicated by arrow 100, materials such as moisture attracting coatings and moisture repelling coatings may be applied by tools 98. Following application of these materials, the surface of conformal coating 96 (or, if conformal coating 96 is not present, structures such as device components, substrates, etc.) may be covered with patterned layers. The patterned layers may include moisture repelling layers such as layer 64 (e.g., a hydrophobic layer). The patterned layers may also include moisture attracting layers such as layer 104 (e.g., a hydrophilic layer). Other layers such as layer 108 may also be formed. Layers such a layer 108 may be more or less hydrophobic than layer 64 (or may be equally hydrophobic) and may be more or less hydrophilic than layer 104 (or may be equally hydrophilic). Uncoated regions such as uncoated surface 106 may also be formed. The water repelling and water attracting characteristics of surface 106 are determined by the nature of the underlying material (i.e., coating 96 or the surface of structures 94 in configurations in which coating 96 is omitted).

Figure 7:
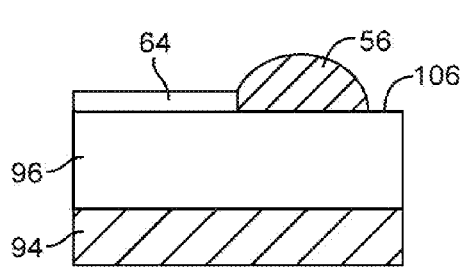
FIG. 7 is a cross-sectional side view of device structures that have been coated with patterned layers such as a liquid repelling coating layer in accordance with an embodiment of the present invention.

FIG. 7 shows an illustrative arrangement in which hydrophobic layer 64 is being used to repel water 56 so that water 56 moves to uncoated region 106 (e.g., in a situation in which uncoated region 106 on layer 96 is more hydrophilic than layer 64 and when layer 64 is therefore more hydrophobic than region 106).

Figure 8:
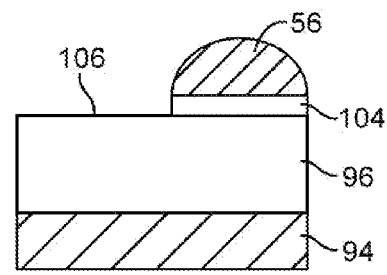
FIG. 8 is a cross-sectional side view of device structures that have been coated with patterned layers such as a liquid attracting coating layer in accordance with an embodiment of the present invention.

FIG. 8 shows an illustrative arrangement in which hydrophilic layer 104 is being used to attract water 56 away from region 106 (e.g., in a situation in which layer 104 is more hydrophilic than uncoated surface 106 of layer 96).

Figure 9:
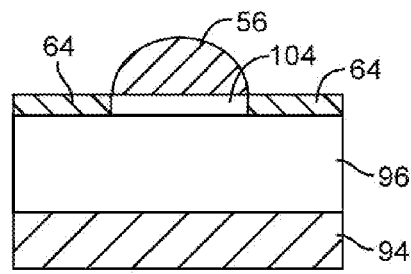
FIG. 9 is a cross-sectional side view of device structures that have been coated with patterned layers such as liquid attracting and liquid repelling coating layers in accordance with an embodiment of the present invention.

FIG. 9 shows an illustrative arrangement in which both hydrophobic layer 64 and hydrophilic layer 104 have been formed on coating layer 96. In this situation, water 56 will be attracted away from layer 64 and towards layer 104 because layer 104 is less hydrophobic and more hydrophilic than layer 64.

Figure 10:
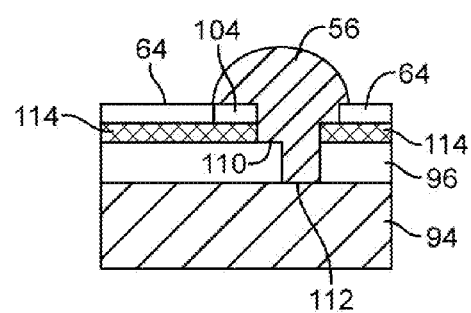
FIG. 10 is a cross-sectional side view of device structures with patterned liquid attracting and liquid repelling coating layers and a patterned interface layer in accordance with an embodiment of the present invention.

In the configuration of FIG. 10, an interface layer such as layer 114 has been interposed between surface layers such as layer 64 and layer 104. It may be difficult to adhere surface layers such as moisture repelling layers to underlying layers such as layer 96. Interface layer 114 may help form an adhesion promotion layer that helps surface layers bond to layer 96. Layer 114 may be formed from ink, polymer, or other suitable coating materials.

Patterns of openings may be formed in the surface layers, interface layer 114, and coating layer 96 to expose surfaces such as surface 110 of coating 96 (which may be hydrophobic) and surface 112 of structures 94 (which may be hydrophobic). Using arrangements of this type, a substrate such as a polyimide substrate (e.g., a flex circuit) such as layer 94 may have mounted sensitive components that are covered with conformal layer 96 and/or conformal layer 96 may be omitted from all or some of layer 94. Ink layer 114 may be patterned to form an adhesion promotion layer for an a subsequent matching hydrophobic layer such as layer 64. Polyimide is naturally hydrophilic, so the uncovered polyimide pattern in this arrangement forms a moisture-guiding channel bounded by hydrophobic region 64.

Figure 11:
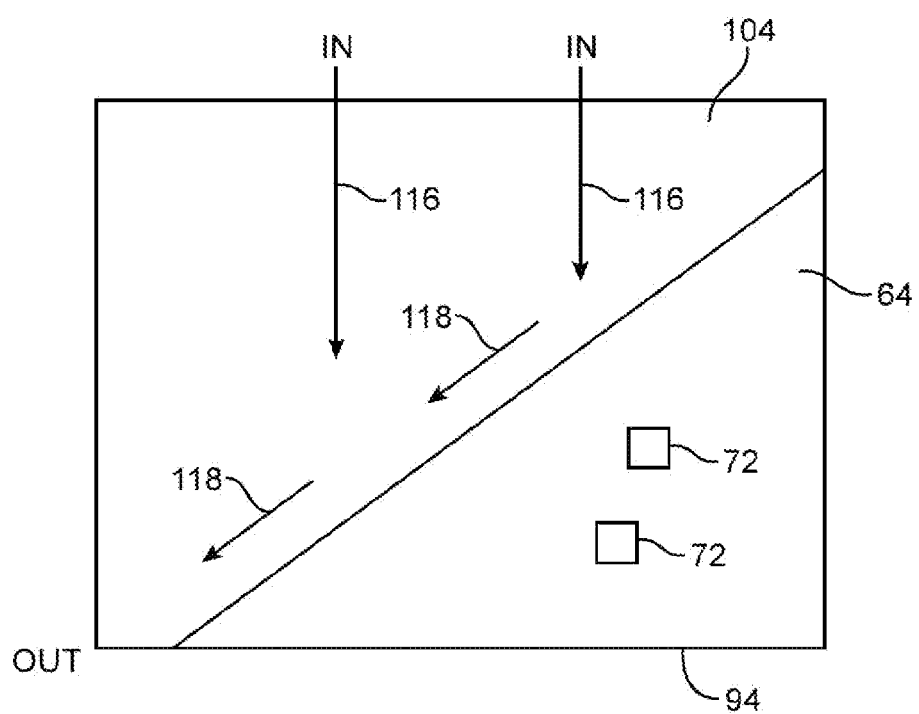
FIG. 11 is a top view of device structures including sensitive device components showing an illustrative pattern of liquid attracting and repelling layers that may be used to prevent liquid from coming into prolonged contact with sensitive device components in accordance with an embodiment of the present invention.

A top view of internal device structures that have been covered with patterned layers of hydrophobic and/or hydrophilic materials is shown in FIG. 11. In the illustrative configuration of FIG. 11, moisture enters structures 94 at entrance points IN. Moisture then flows in the direction of arrows 116. Region 104 may be covered with a hydrophilic material and region 64 may be covered with a hydrophobic material (i.e., region 64 may be more hydrophobic and less hydrophilic than region 104). This pattern may therefore cause moisture to be deflected from paths 116 towards exit location OUT along paths 118.

Figure 12:
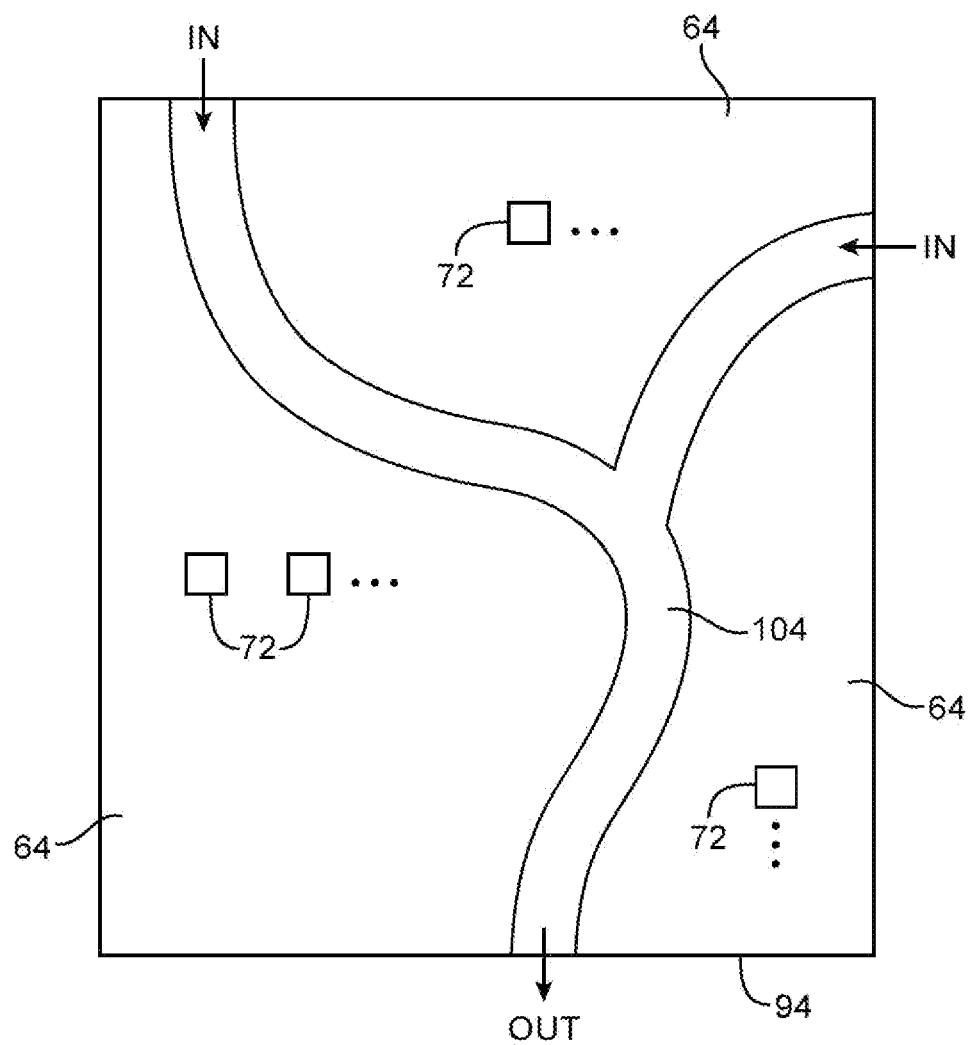
FIG. 12 is a top view of device structures including sensitive device components showing an illustrative pattern of liquid attracting and repelling layers that may be used to create a multibranch channel for guiding liquid between a moisture entrance location and a moisture exit location that is away from the sensitive device components in accordance with an embodiment of the present invention.

FIG. 12 shows an illustrative configuration in which the coating pattern on structures 94 has been used to form a multibranch moisture guiding channel (hydrophilic region 104) that is bounded by hydrophobic regions 64. The channel may help guide moisture from moisture ingress points IN towards moisture exit location OUT.

Figure 13:
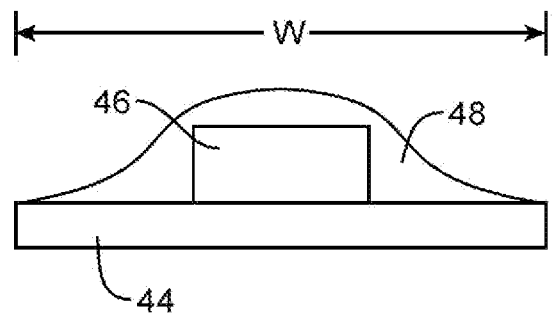
FIG. 13 is cross-sectional side view of a conventional conformal coating that is covering an integrated circuit on a printed circuit board.

FIG. 13 is a cross-sectional side view of a conventional conformal coating 48 covering integrated circuit 46 on printed circuit board 44. As shown in FIG. 13, the surface of board 44 may attract conformal coating 48, causing conformal coating 48 to spread significantly until reaching relatively wide lateral dimension W.

Figure 14:
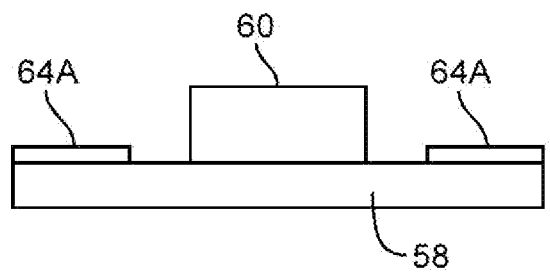
FIG. 14 is a cross-sectional side view of a device component mounted on a substrate that has a patterned liquid repelling coating layer such as an oleophobic layer in accordance with an embodiment of the present invention.
Figure 15:
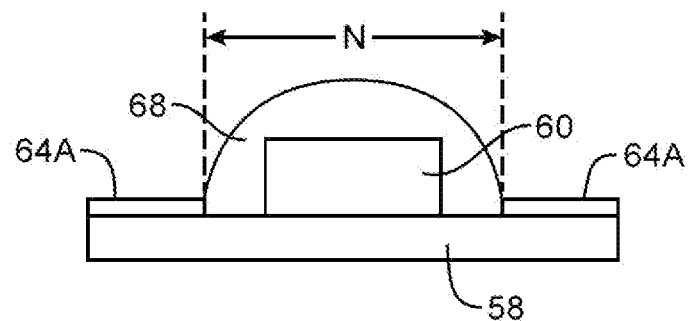
FIG. 15 is a cross-sectional side view of the device component of FIG. 14 showing how a conformal coating may be laterally constrained by the patterned liquid repelling coating layer in accordance with an embodiment of the present invention.

FIG. 14 shows how moisture repelling coating material such as material 64A may be formed around sensitive component 60 (e.g., a sensitive component such as component 60 of FIG. 4). Material 64A may be provided in a layer that has the shape of a ring with a central rectangular or circular opening (as examples). Material 64A may be formed from an oleophobic (hydrophobic) substance that repels conformal coating layer 68. When layer 68 is deposited over component 60, the presence of material 64A ensures that layer 68 extends laterally only as far as lateral dimension N, as shown in FIG. 15. Lateral dimension N may be smaller than dimension W of FIG. 13 and/or may be more well controlled than dimension W.

Figure 16:
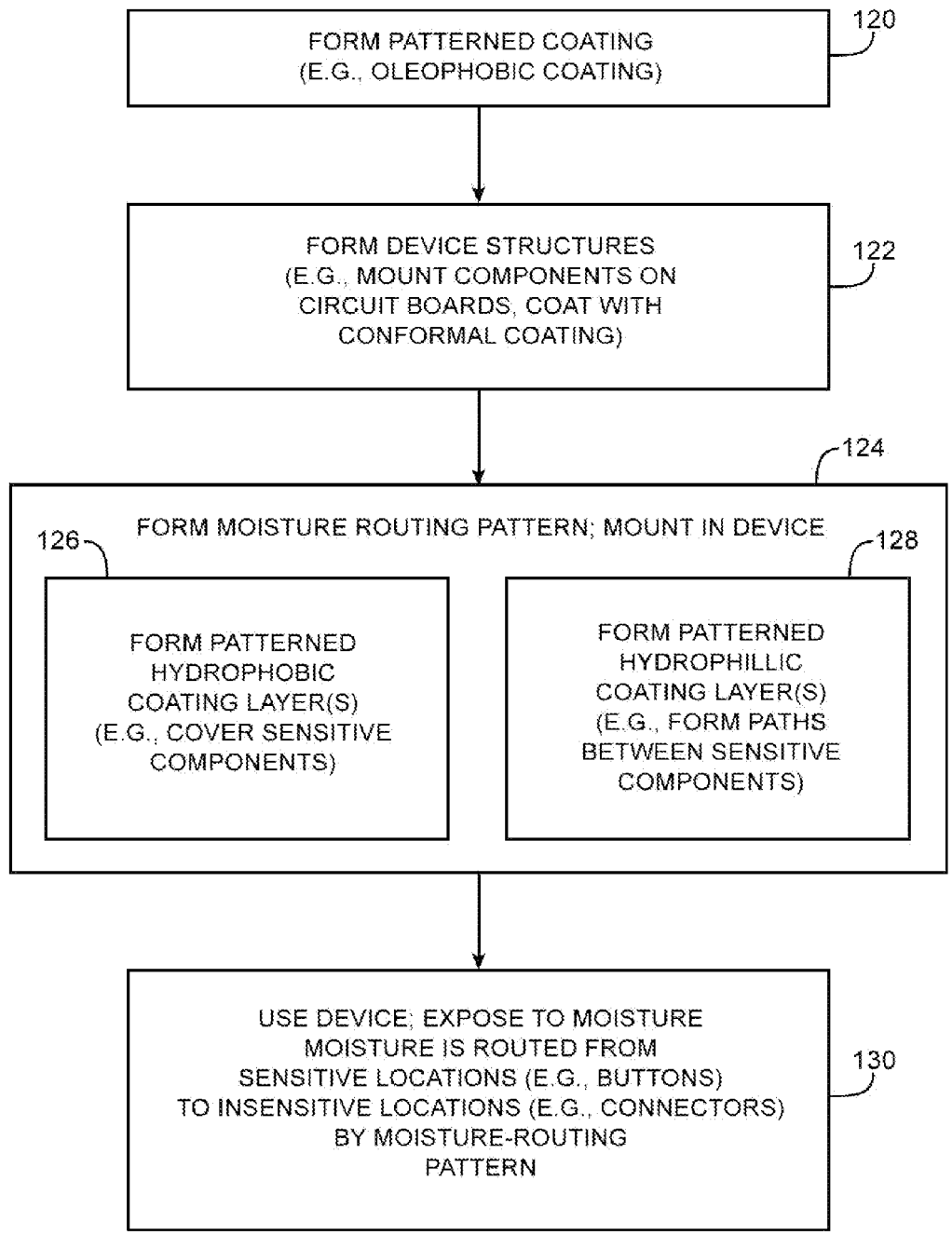
FIG. 16 is a flow chart of illustrative steps involved in forming device structures that incorporate patterned liquid repelling regions and liquid attracting regions in accordance with an embodiment of the present invention.

Illustrative steps involved in forming moisture repelling and moisture attracting layers in device 10 and/or in forming conformal coating layers in device 10 are shown in FIG. 16.

At step 120, a patterned layer such as layer 64A of FIG. 14 may be formed on a support structure such as substrate 58 (e.g., structures 94 of FIG. 6). During the operations of step 120, a conformal coating layer such as layer 68 of FIG. 15 may be formed over one or more sensitive components 60. The presence of layer 64A (e.g., a hydrophobic and/or oleophobic layer) may limit the lateral spreading of conformal coating layer 68 (e.g., to help confine layer 68 to the region surrounding sensitive component 60).

At step 122, other device structures may be formed (e.g., by mounting sensitive components such as components 60 and 72 and other internal components for device 10 to printed circuits boards, housing structures, ceramic substrates, glass substrates, underlying devices, and other support structures). These device structures may optionally be coated with conformal coating material (e.g., without using moisture repelling layers such as layer 64A of FIG. 15).

During the operations of step 124, moisture repelling coatings may be deposited and patterned (e.g., hydrophobic coating layers such as layer 64 may be formed during the operations of step 126) and moisture attracting coatings may be deposited and patterned (e.g., hydrophilic coating layers such as layer 104 may be formed during the operations of step 128). One, two, three, four, or more than four different regions may be formed, each having a potentially different respective amount of hydrophobic and hydrophilic behavior. Tools 98 may be used in forming patterned coating layers and/or layers such as conformal coating layer 96. Techniques that may be used by tools 98 in forming layers during step 124 include spraying, dipping, inkjet printing, painting, pad printing, screen printing, shadow masking, lift-off, etc. Light may be applied to cure deposited layers, lasers and other tools may be used to pattern layers, layers may be heated to cure and/or dry materials, etc.

Following formation of the layers of step 124 (or earlier, in step 122 or step 120), the patterned layers and underlying structures may be mounted in housing 12 of device 10.

A completed device (e.g., device 10 of FIG. 1) may be exposed to moisture during normal operation (step 130). When exposed in this way, the moisture repelling regions on structures 94, the moisture attracting regions on structures 94, and the associated moisture-guiding channels and other structures that are formed may help to guide and move moisture away from buttons 16 and other sensitive device components and device locations towards connector 18 and other insensitive components and device locations.

The foregoing is merely illustrative of the principles of this invention and various modifications can be made by those skilled in the art without departing from the scope and spirit of the invention. The foregoing embodiments may be implemented individually or in any combination.

What is claimed is:

1. An electronic device, comprising:
   a housing;
   at least one electronic component mounted on a substrate in the housing;
   a coating on the substrate that surrounds the at least one electronic component;
   a conformal coating that covers the at least one electronic component and is laterally constrained by the coating that surrounds the at least one electronic component, wherein the conformal coating is in direct contact with the coating and wherein the conformal coating and the coating are non-overlapping; and
   a hydrophobic coating that is formed in direct contact with the conformal coating, wherein the hydrophobic coating overlaps substantially all of the conformal coating.

2. The electronic device defined in claim 1 wherein the coating on the substrate that surrounds the at least one electronic component comprises an additional hydrophobic coating.

3. The electronic device defined in claim 2 wherein the at least one electronic component covered by the conformal coating is a moisture-sensitive electronic component.

4. The electronic device defined in claim 3 further comprising:
   a connector mounted in the housing; and
   a patterned hydrophilic coating layer on the substrate, wherein the patterned hydrophilic coating layer forms a moisture guiding channel that directs moisture away from the moisture-sensitive electronic component towards the connector.

5. The electronic device defined in claim 1 wherein the coating on the substrate that surrounds the at least one electronic component comprises an oleophobic coating.

6. The electronic device defined in claim 5 wherein the at least one electronic component covered by the conformal coating is a moisture-sensitive electronic component.

7. The electronic device defined in claim 6 further comprising:
   a connector mounted in the housing; and
   a patterned hydrophilic coating layer on the substrate, wherein the hydrophilic coating layer forms a moisture-guiding channel that directs moisture away from the moisture-sensitive electronic component towards the connector.

8. The electronic device defined in claim 1, wherein the hydrophobic coating is formed from a material selected from the group consisting of: parylene, silicone, and polytetrafluoroethylene.

9. The electronic device defined in claim 8, wherein the coating on the substrate is formed from a material selected from the group consisting of: parylene, silicone, and polytetrafluoroethylene.

10. The electronic device defined in claim 9, wherein the conformal coating is formed from a material selected from the group consisting of: epoxy, silicone, parylene, acrylic, and polyurethane.

11. An electronic device, comprising:
    a housing;
    a printed circuit board in the housing;
    at least one moisture-sensitive electronic component mounted to the printed circuit board;
    a coating on the printed circuit board that surrounds the at least one moisture-sensitive electronic component;
    a conformal coating that covers the at least one moisture-sensitive electronic component and is laterally constrained by the coating that surrounds the at least one moisture-sensitive electronic component; and
    patterned coating layers on the printed circuit board that direct water away from the at least one moisture-sensitive electronic component and towards a moisture-insensitive component in the electronic device, wherein the patterned coating layers include a patterned hydrophilic coating layer on the substrate, and wherein the patterned hydrophilic coating layer forms a moisture guiding channel that directs moisture away from the at least one moisture-sensitive electronic component.

12. The electronic device defined in claim 11 wherein the patterned coating layers comprise first and second portions of a hydrophobic coating layer, and wherein the hydrophilic coating layer is bordered by and interposed between the first and second portions of the hydrophobic coating layer.

13. The electronic device defined in claim 12 wherein the hydrophilic coating layer comprises a material selected from the group consisting of: metal oxide, material in which metal oxide particles have been incorporated within a binder, polyurethane, and polyethylene oxide, and wherein the hydrophobic coating layer comprises a material selected from the group consisting of: parylene, silicone, and polytetrafluoroethylene.

14. An electronic device, comprising:
    a housing;
    at least one electronic component mounted on a substrate in the housing;
    a moisture-insensitive component mounted in the housing; and
    a patterned hydrophilic coating layer on the substrate, wherein the patterned hydrophilic coating layer forms a moisture guiding channel that directs moisture away from the at least one electronic component towards the moisture-insensitive component.

* * * * *